(12) United States Patent
Song et al.

(10) Patent No.: US 7,638,802 B2
(45) Date of Patent: Dec. 29, 2009

(54) FLAT PANEL DISPLAY INCLUDING THIN FILM TRANSISTOR SUBSTRATE

(75) Inventors: Keun-kyu Song, Gyeonggi-do (KR); Yong-uk Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/506,392

(22) Filed: Aug. 18, 2006

(65) Prior Publication Data

US 2007/0103613 A1    May 10, 2007

(30) Foreign Application Priority Data

Oct. 20, 2005    (KR) .................. 10-2005-0098946

(51) Int. Cl.
*H01L 31/00*    (2006.01)

(52) U.S. Cl. .............. 257/59; 257/40; 257/72; 257/E31.041

(58) Field of Classification Search .......... 257/40, 257/59, 72; 349/42
See application file for complete search history.

(56) References Cited

U.S. PATENT DOCUMENTS

| | | | |
|---|---|---|---|
| 6,057,896 A * | 5/2000 | Rho et al. ............ | 349/42 |
| 6,583,829 B2 | 6/2003 | Ootsu et al. | |
| 6,909,415 B2 * | 6/2005 | Kumagawa et al. ..... | 345/92 |
| 2003/0047729 A1 * | 3/2003 | Hirai et al. ........... | 257/40 |
| 2004/0233374 A1 * | 11/2004 | Yamazaki et al. ....... | 349/153 |

FOREIGN PATENT DOCUMENTS

| | | |
|---|---|---|
| CN | 1311522 | 9/2001 |
| CN | 1366653 A | 8/2002 |
| CN | 1297720 A | 1/2006 |
| JP | 05-134629 | 5/1993 |
| JP | 09-061812 | 3/1997 |
| JP | 09-068724 | 3/1997 |
| JP | 2001-244467 A | 9/2001 |
| JP | 2001-264818 A | 9/2001 |
| JP | 2002-072250 A | 3/2002 |
| JP | 2003-043489 A | 2/2003 |
| JP | 2004-012726 A | 1/2004 |
| JP | 2004-117689 A | 4/2004 |
| JP | 2005-142474 A | 6/2005 |

OTHER PUBLICATIONS

Machine Translation of JP 05-134629.*
Machine Translation of JP 09-061812.*
Machine Translation of JP 09-068724.*

* cited by examiner

*Primary Examiner*—Jerome Jackson, Jr.
*Assistant Examiner*—Anthony Ho
(74) *Attorney, Agent, or Firm*—Innovation Counsel LLP

(57) ABSTRACT

A flat panel display includes a plurality of gate lines; a plurality of data lines insulated with the gate lines, the data lines defining a pixel by intersecting the gate line; and a thin film transistor (TFT) being provided in each of the pixels and containing an organic semiconductor layer, wherein a distance between the adjacent TFTs in a direction extended to the gate line is longer than a width of the pixel in a direction extended to the gate line.

16 Claims, 7 Drawing Sheets

FLAT PANEL DISPLAY INCLUDING THIN FILM TRANSISTOR SUBSTRATE

CROSS-REFERENCE TO RELATED APPLICATIONS

This application claims priority from Korean Patent Application No. 2005-0098946, filed on Oct. 20, 2005, in the Korean Intellectual Property Office, the disclosure of which is incorporated herein by reference.

BACKGROUND OF INVENTION

1. Field of Invention

The present invention relates to a flat panel display, and more particularly, to a flat panel display containing an organic semiconductor layer.

2. Description of the Related Art

A flat panel display includes a thin film transistor substrate provided with a thin film transistor (TFT) serving as a switching or driving device for controlling or driving an operation of each pixel. Typically, the TFT comprises a gate electrode, source and drain electrodes separated by the gate electrode disposed therebetween to define a channel region, and a semiconductor layer. The semiconductor layer uses amorphous silicon or poly silicon. Recently organic semiconductors have been applied to the semiconductor layer.

Advantageously, an organic semiconductor may be formed at ordinary temperatures and pressures, thereby reducing manufacturing costs, and it can be applied to a plastic substrate using by heat. As an additional advantage, the organic semiconductor can be formed through an inkjet method, because it is fusible.

In order to form an organic semiconductor layer using the inkjet method, a space is first formed using a bank to allow an organic semiconductor solution to be jetted therein, and after the organic semiconductor solution is jetted into the bank the organic semiconductor layer is formed through a solvent removing process.

However, when the organic semiconductor solution is jetted, the jetted drops of organic semiconductor solution may bounce, entering the bank of an adjacent pixel. Bouncing can be problematic because the thicknesses of organic semiconductor layers in the pixels may differ from one another, creating nonuniform TFTs. In the case of a high-precision flat panel display having pixels highly integrated therein, it is more difficult to control the inkjet process, imparting nonuniformities to the pixels as well as the TFTs.

SUMMARY OF THE INVENTION

Accordingly, it is an aspect of the present invention to provide a flat panel display with uniform TFT properties.

The foregoing and/or other aspects of the present invention can be achieved by providing a flat panel display, having a plurality of gate lines; a plurality of data lines insulated from the gate lines, with each of the data lines defining a pixel by intersecting with a respective gate line; and a thin film transistor (TFT) being provided in each of the pixels. The TFT contains an organic semiconductor layer, wherein a distance between the adjacent TFTs in a direction extended to the gate line is longer than a width of the pixel in a direction extended to the gate line.

According to an aspect of the present invention, the pixel comprises first and second pixels adjacent to each other in a direction extended to the gate line, and the TFT comprises first and second TFTs which are respectively provided in the first and the second pixels; and wherein the first TFT is provided in a middle region of the first pixel while being adjacent to the data line, and the second TFT is provided in a lower region of the second pixel while being adjacent to the gate line.

According to an aspect of the present invention, the flat panel display further comprises an additional gate line dividing the pixel into upper and lower parts, wherein the first TFT is connected to the additional gate line.

According to an aspect of the present invention, the flat panel display further comprises a branch gate line branched from the gate line and extended along the data line while being adjacent to the data line, wherein the first TFT is connected to the branch gate line.

According to an aspect of the present invention, the branch gate line is extended to the middle region of the first pixel.

According to an aspect of the present invention, the pixel comprises first and second pixels adjacent to each other in a direction extended to the gate line, and the TFT comprises first and second TFTs which are respectively provided in the first and the second pixels; and wherein the first TFT is provided in an upper region of the first pixel while being adjacent to the data line, and the second TFT is provided in a lower region of the second pixel while being adjacent to the gate line.

According to an aspect of the present invention, the first and the second pixels are alternatingly arranged relative to each other.

According to an aspect of the present invention, the distance between the adjacent TFTs is between about 1.2 to about 3.16 times larger than a width of the pixel.

According to an aspect of the present invention, the organic semiconductor layer is formed by an inkjet method.

According to an aspect of the present invention, the TFT comprises a gate electrode formed on an insulation substrate. The source electrode and the drain electrode are spaced apart, defining a channel region with the gate electrode being interposed therebetween. The organic semiconductor layer is formed on the channel region.

According to an aspect of the present invention, the flat panel display further comprises a bank for surrounding the channel region and for exposing at least a portion of each of the source electrode and the drain electrode, wherein the organic semiconductor layer is formed inside the bank.

According to an aspect of the present invention, each of the source electrodes and the drain electrodes is made of one of ITO or IZO.

According to an aspect of the present invention, a surface of the bank has water repellency and oil repellency.

According to an aspect of the present invention, the TFT comprises a light shielding film formed on the insulation substrate; an insulation film covering the light shielding film; and source and drain electrodes being spaced apart and defining a channel region having the light shielding film interposed therebetween; and the organic semiconductor layer, which is formed on the channel region.

According to an aspect of the present invention, the flat panel display further comprises a gate electrode formed at a location corresponding to the light shielding film on the organic semiconductor layer, and a first protection film interposed between the organic semiconductor layer and the gate electrode.

According to an aspect of the present invention, the organic semiconductor layer comprises one of a derivative containing tetracene or pentacene substituents; oligothiophene having 4 to 8 thiophene rings coupled to one another through 2 and 5 positions of thiophene rings; perylenetetracarboxylic dianhydride (PTCDA) or an imide derivative thereof; naphthalene-tetracarboxylic dianhydride (NTCDA) or an imide derivative thereof; metallized pthalocyanine or a halogenated derivative thereof; perylene or coronene and a derivative containing substituents thereof; co-oligomer or co-polymer of thienylene and vinylene; thiophene thienylene or coronene, and a derivative containing substituents thereof; and a derivative containing one or more hydrocarbon chains of 1 to 30 carbons in an aromatic or heteroaromatic ring of said materials.

BRIEF DESCRIPTION OF THE DRAWINGS

The above and/or other aspects and advantages of the prevent invention will become apparent and more readily appreciated from the following description of the exemplary embodiments, taken in conjunction with the accompany drawings, in which.

DETAILED DESCRIPTION

Figure 1:
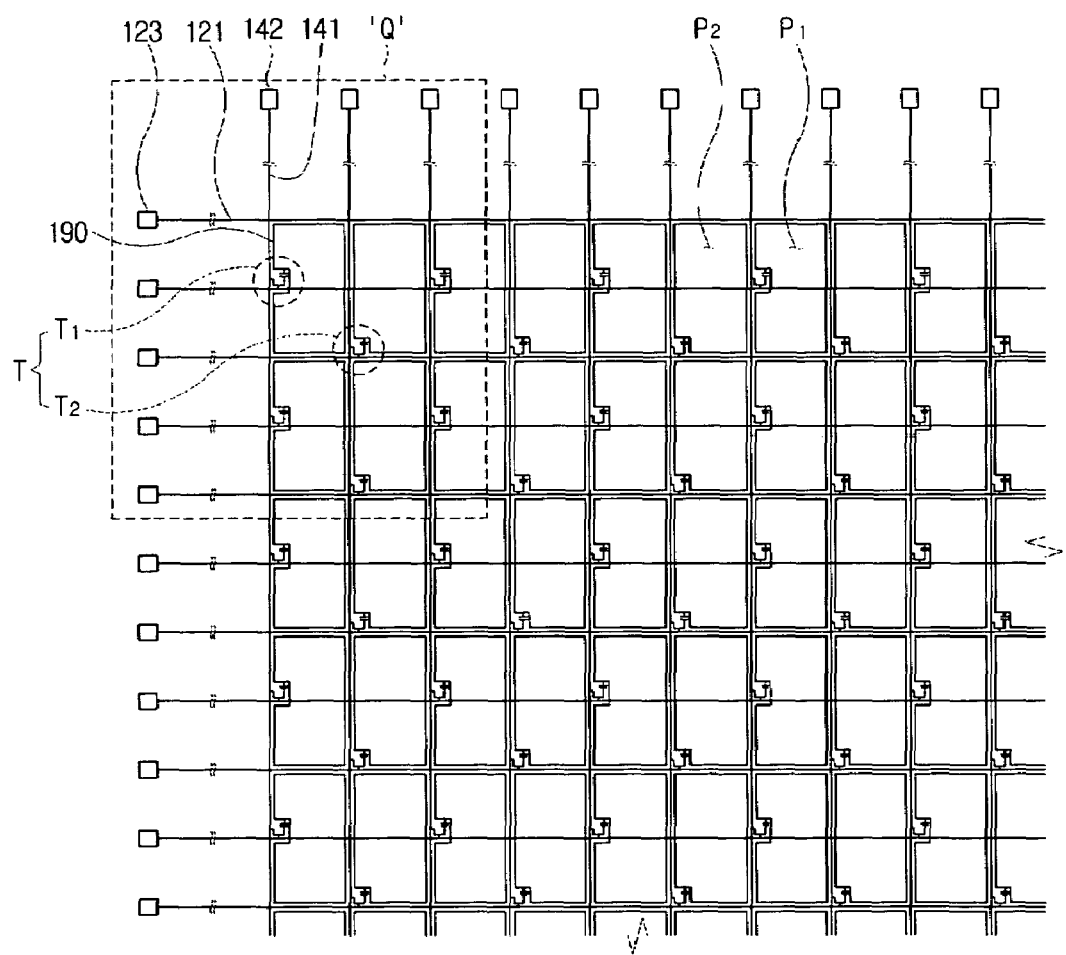
FIG. 1 is a layout view of a TFT substrate according to a first embodiment of the present invention.

Reference will now be made in detail to the embodiments of the present invention, examples of which are illustrated in the accompanying drawings, wherein like reference numerals refer to like elements throughout. The embodiments are described below so as to explain the present invention by referring to the figures. It will be understood that if one film (layer) is formed (located) "on" another film (layer), this means not only a case where two films (layers) are in contact with each other but also a case where another film (layer) is interposed between two films (layers). Further, it will be apparent that although a liquid crystal display is described below as an illustrative example, it is not limited thereto but may be applicable for other flat panel displays such as OLEDs and PDPs.

Figure 2:
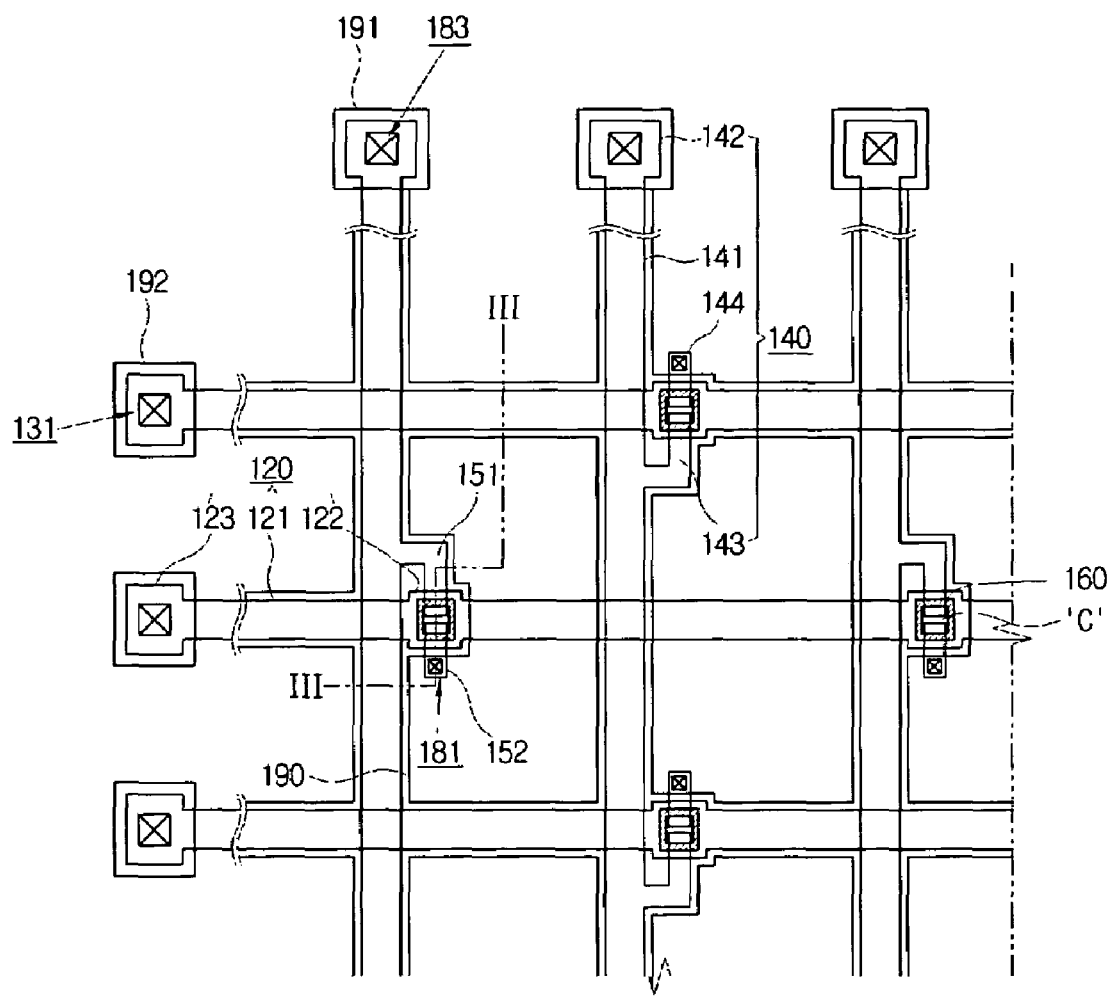
FIG. 2 is an enlarged plan view of a region 'Q' of FIG. 1.
Figure 3:
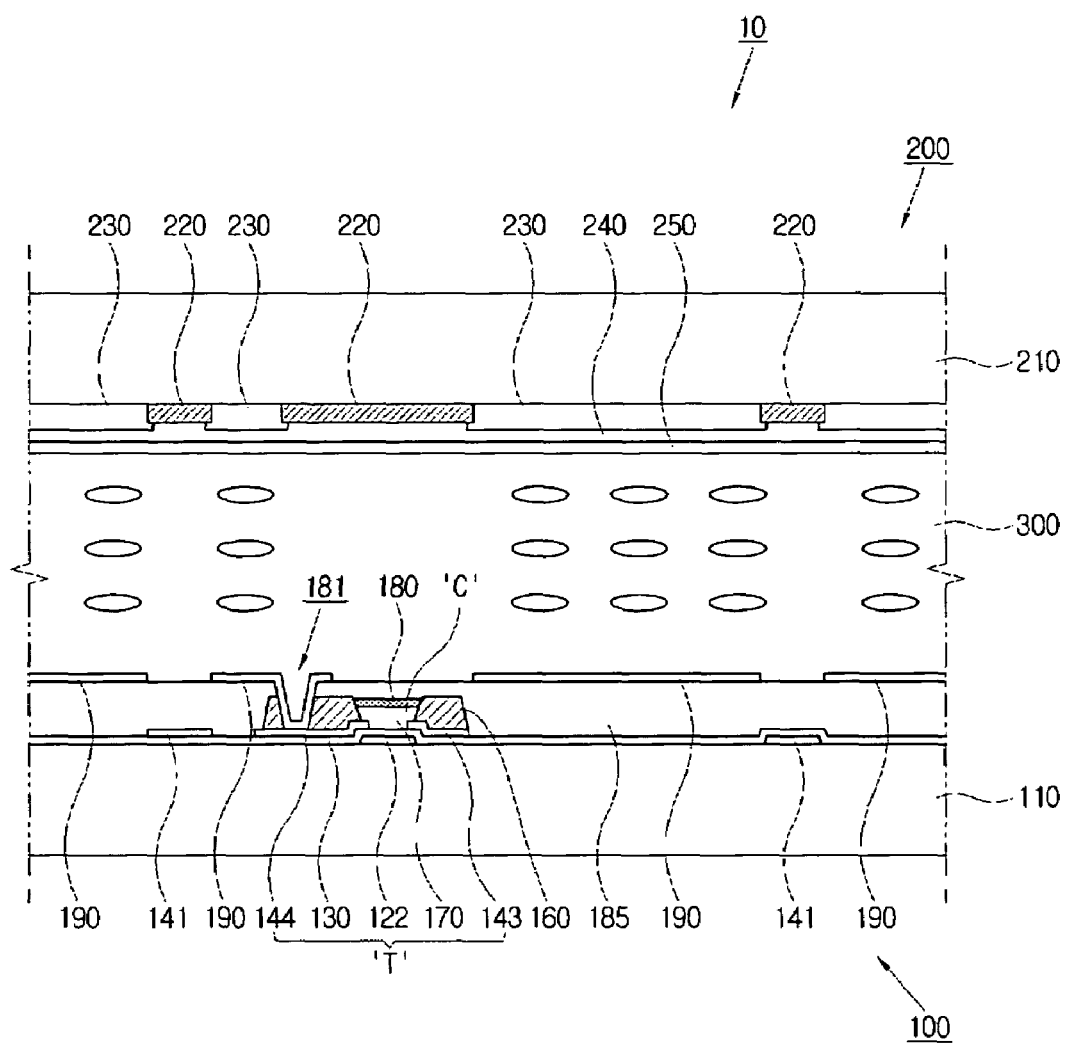
FIG. 3 is a cross-sectional view taken along line III-III of FIG. 2.

FIG. 1 is a layout view of a TFT substrate according to a first embodiment of the present invention, FIG. 2 is an enlarged plan view of a region 'Q' of FIG. 1, and FIG. 3 is a cross-sectional view taken along line III-III of FIG. 2.

A flat panel display 10, according to the present invention, comprises a thin film transistor (TFT) substrate 100, a color filter substrate 200, and a liquid crystal layer 300 interposed between both substrates 100 and 200. TFT substrate 100 is provided with a TFT, which can serve as a switching device for controlling an operation of a pixel; or a driving device for driving an operation of a pixel. The color filter substrate 200 is combined with, and faces, the TFT substrate 100.

First, the TFT substrate 100 will now be described. The TFT substrate 100 comprises an insulation substrate 110; a plurality of gate wires 120 and data wires 140 formed in a matrix on the insulation substrate 110; a thin film transistor (TFT) T serving as a switching device formed at an intersection of the gate wire 120 and the data wires 140; and a pixel electrode 190 connected to the TFT T. A signal voltage is applied via the TFT T to the liquid crystal layer 300 between the pixel electrode 190, and a common electrode 250 of the color filter substrate 200, with the liquid crystal layer 300 being arranged in accordance with the signal voltage, so that light transmittance is established thereby.

The insulation substrate 110 can include an insulation material including without limitation glass, quartz, ceramic and plastic. Advantageously, a plastic substrate can be used where the TFT T3 is used in the manufacture of a flexible flat panel substrate 10. Here, the plastic substrate may be made of a suitable plastic material, including without limitation one of PC (polycarbonate), PI (polyimide), PNB (polynorbornene), PES (polyethersulphone), PAR (polyacrylate), PEN (polyethylene naphthenate) and PET (poly(ethylene terephthalate)) plastic materials.

In general, the gate wire 120, such as is a conductive metal film, formed on the insulation substrate 110, using suitable conductive metal film including without limitation, one of Au, Pt, Pd, Al, Cr, Al/Cu, or MoW conductive metal film. Conveniently, the gate wire 120 may be formed as a single layer conductive metal film or as a double layer conductive metal film. The gate wire 120 includes a gate line 121, a gate pad 123, and a gate electrode 122. The gate electrode 122 is a portion of a gate line 121 that becomes part of the TFT T. The gate pad 123 enables an applied external gate signal to be transmitted over gate line 121 to the gate electrode 122. In general, the gate wire 120 comprises a plurality of gate lines 121 extended in a transverse direction.

In general, a gate line is connected to a plurality of gate electrodes, with the gate electrodes for a respective gate line being provided in an alternating fashion to the pixels traversed by the respective gate line. For example, with regard to FIG. 1 and FIG. 2, first pixel P1 is disposed adjacent to second pixel P2. The first gate line 121a extends to, and traverses, the second pixel P2 and the adjacent first pixel P1. The second gate line 121b extends to and along a lower periphery of second pixel P2 and adjacent first pixel P1. The second gate line 121b is extends in a direction generally parallel to first gate line 121a. The first gate line 121a is connected to gate electrodes 122a, 122c, which are provided in an alternating fashion to every other pixel traversed by the respective first gate line 121a. Additional gate electrodes, such as gate electrode 122b, are connected to a second gate line 121b and are provided in an alternating fashion to the pixels adjacent to the first gate line pixels. First gate line 121a supplies a gate signal to a gate electrode 122, for example, disposed in an upper portion of pixel P1, and second gate line 121b supplies a gate signal to a gate electrode 122, for example, in a lower portion of adjacent pixel P2. In the alternating fashion, first gate line 121a also connects to a pixel traversed by first gate line 121a, which is adjacent to second pixel P2 but which is generally opposite first pixel P1, relative to the position of second pixel P2. In a similar alternating fashion, second gate line 121b also connects to a pixel disposed along second gate line 121b, which is adjacent to first pixel P1 but which is generally opposite second pixel P2, relative to the position of first pixel P1.

An insulation film 130 is a layer for electrical insulation between the gate wire 120 and the data wire 140 that covers the gate wire 120 on the insulation substrate 110. The insulation film 130 can be made of an inorganic material such as silicon nitride (SiNx) or silicon oxide (SiOx). In addition, although it is not shown, an film made of an organic material may be formed on the inorganic insulation film 130. A thick organic film may be desirable to protect the subsequently deposited organic semiconductor layer 170 from attack by a residual chemical material or a plasma used during subsequent process steps, such as the creation of contact hole 181, or of a contact hole 131 for exposing the gate pad 123, formed on the insulation film 130. In embodiments in which the insulation film 130 is an organic film, it may be desirable to include at least one of an organic materials such as BCB (benzocyclobutene), Si polymer, or PVV (polyparaphenylenevinylene).

The data wire 140 comprises a data line 141 extended in one direction on the insulation wire 130, a data pad 142 formed at one end of the data line 141 for receiving a driving or control signal from the outside, a source electrode 143 branched from the data line and then extended to the gate electrode 122, and a drain electrode 144 located opposite the source electrode 143. The gate electrode 122 is disposed source electrode 143 and drain electrode 144. The data wire 140 may include an inexpensive metal with good conductivity including without limitation Al, Cr, or Mo metal, as well as more expensive but suitably conductive metals including without limitation Au, Pt, and Pd. Further, for simplicity, the data wire 140 may be made of the same material as the gate wire 120. Conveniently, the data wire 140 may be formed as a single metal layer or as a double metal layer. The data line 141 is insulated from the gate line 121. A pixel can be defined by intersecting the gate line 121 with the data line 141. In FIG. 2, for example, the region between the source electrode 143 and the drain electrodes 144 proximate to the gate electrode 122 is defined a channel region 'C.'.

Desirably, the source electrode 143 and the drain electrode 144 may be made of a conductive polymer including without limitation ITO (Indium Tin Oxide) and IZO (Indium Zinc Oxide), because both ITO (Indium Tin Oxide) and IZO (Indium Zinc Oxide) generally exhibit a large work function, and, in comparison to metals, tend to simplify sputtering and micro-pattern formation.

A bank 160 is formed on the source electrode 143, the drain electrode 144 and a portion of the insulation film 130 which the source and drain electrodes do not cover. The bank 160 functions as a frame for forming the organic semiconductor layer 170, in general, to prevent the organic semiconductor layer 170 from being irregularly formed because of undesirable non-uniformities in the placement, positioning, or amount of organic semiconductor material being applied.

A portion of the bank 160 forms a closed space surrounding the channel region 'C', while at the same time, permitting at least a portion of each of the source electrode 143 and the drain electrode 144 to be exposed. The bank 160 may be made of fluoropolymer. Typically, it is desirable to constitute bank 160 such that it possesses a wettability characteristic generally opposite that of the ink to be applied, or dropped, onto bank 160. Thus, where the ink exhibits a hydrophilic property, bank 160 can be constituted to exhibit a hydrophobic property, relative to the ink. On the other hand, where the ink exhibits a hydrophobic property, bank 160 can be constituted to exhibit a hydrophilic property, relative to the ink. The fluoropolymer has a known property by which it simultaneously exhibits a water repellency property and an oil repellency property. Suitable fluoropolymers for use as bank 160 can include without limitation PTFE (polytetrafluoroethylene), FEP (fluoroethylene-propylene), PFA (perfluoralkoxy), ETFE (ethylene-tetrafluoroethylene-copolymer), and PVDF (polyvinylidene fluoride).

The bank 160 surrounding the channel region 'C' has a form in which the width of the bank 160 becomes narrow in the direction of bottom to top thereof, and its height may be about 2.7 μm. The drain contact hole 181 for exposing the drain electrode 144 is formed in a portion of the bank 160. In a case where the bank 160 is photosensitive, it may be formed through a coating, light-exposing, and developing process, and in a case where the bank 160 is non-photosensitive, it may be formed through a photo-etching process using a photoresist after coating.

An organic semiconductor layer 170 is located inside the bank 160. The organic semiconductor layer 170 fills the channel region 'C' and covers the exposed source and drain electrodes 143 and 144. The organic semiconductor layer 170 is formed by means of an inkjet method, and a organic semiconductor substance, dissolved in an aqueous solution or organic solvent is used. A high molecular weight organic semiconductor is desirable for use with an inkjet process because such substances are generally dissolved well in a solvent However, a low molecular weight organic semiconductor substance that is dissolves well in an organic solvent also may be used.

In selected embodiments, the organic semiconductor layer 170 may be a derivative containing tetracene or pentacene substituents, or oligothiophene having 4 to 8 thiophene rings coupled to one another through 2 and 5 positions of the thiophene rings.

Further, the organic semiconductor layer 170 may be perylenetetracarboxylic dianhydride (PTCDA) or an imide derivative thereof, or naphthalenetetracarboxylic dianhydride (NTCDA) or an imide derivative thereof.

Furthermore, the organic semiconductor layer 170 may be metallized pthalocyanine or a halogenated derivative thereof, or perylene or coronene and a derivative containing substituents thereof. Here, it is desirable that a metal added to the metallized pthalocyanine be, for example, copper, cobalt or zinc.

In addition, the organic semiconductor layer 170 may be co-oligomer or co-polymer of thienylene and vinylene. Alternatively, the organic semiconductor layer 170 may be thienylene or coronene, and a derivative containing substituents thereof. Further, the organic semiconductor layer 170 may be a derivative containing one or more hydrocarbon chains of 1 to 30 carbons in an aromatic or heteroaromatic ring of the above materials.

A first protection film 180 is formed on the organic semiconductor layer 170. The first protection film 180 covers the organic semiconductor layer 170 and may be made of at least a material such as PVA (polyvinyl alcohol), BCB (benzocyclobutene), acrylic resin, or Si polymer. In addition, the first protection film 180 may be made of an acrylic photosensitive organic film or a silicon nitride film. The first protection film 180 is a layer for preventing deterioration of a property of the organic semiconductor layer 170. Further, the first protection film 180 may be formed by means of an inkjet method.

Further, a second protection film 185 may be formed on the first protection film 180. The second protection film 185 is applied to the entire surface of the insulation substrate 110, while also covering the first protection film 180. The second protection film 185 is a layer for preventing deterioration of a property of the organic semiconductor layer 170 in a manner similar to the first protection film 180. Film 185 may be made of a material identical to or similar to the first protection film 180, but such is not required. Further, the second protection film 185 is removed from the drain contact hole 181 for exposing the drain electrode 144.

A pixel electrode 190 is formed on the second protection film 185. The pixel electrode 190 is made of a transparent conductive material such as ITO (Indium Tin Oxide) or IZO (Indium Zinc Oxide), and connected with the drain electrode 144 through the drain contact hole 181. Further, there are provided a gate pad contact member 192 and a data pad contact member 191 for covering the gate pad contact hole 131 and the data pad contact hole 183, respectively. The gate pad contact member 192 and the data pad contact member 191 are made of a transparent conductive material identical to the pixel electrode 190.

Next, the color filter substrate 200 will now be described. The same as the TFT substrate 100, the color filter substrate 200 may be formed using an insulating substrate 210 containing a material such as glass, quartz, ceramic or plastic. Also, the color filter substrate 200 comprises a color filter 230 having the tree primary colors of red, green and blue, or, if used, of cyan, magenta and yellow, a black matrix 220 formed regions between the color filters 230, which are provided on the insulating substrate 210 and a common electrode 250 formed on the black matrix 220 and the color filter 230.

Further, the color filter substrate 200 further comprises an overcoat layer 240 interposed between the black matrix 220 and the color filter 230, and the common electrode 250.

The black matrix 220 divides between colors of the color filters 230 having the three primary colors of red, green, and blue, or, if used, of cyan, magenta, and yellow, so that light may be prevented from leaking between the pixels, and from being incident on the TFT T, thereby tending to preserve picture quality. The black matrix 220 may be a single or multilayered metal layer made of chrome, chrome oxide, or chrome nitride, or effective combinations thereof. The black matrix 220 also may be a photosensitive organic material having a black type pigment for shielding light added therein, with carbon black, titanium oxide or the like being suitable for use as the black type pigment.

The color filters 230 are formed with the black matrix 220 as borders such that red, green and blue, or, if used, cyan, magenta and yellow, are repeated, and function to provide colors to light which is radiated through the liquid crystal layer 300 from a backlight assembly (not shown). The color filter 230 may be made of a photosensitive organic material, and can be formed using a coloring photosensitive organic material by a known pigment dispersion method.

The overcoat layer 240 protects and planarizes the color filter 230, and is formed mainly using an acrylic epoxy material.

The common electrode 250 is made of a transparent conductive material such as ITO (Indium Tin Oxide) or IZO (Indium Zinc Oxide). The common electrode 250 directly applies a signal voltage to the liquid crystal layer 300 together with the pixel electrode 190 of the TFT substrate 100.

The TFT substrate 100 and the color filter substrate 200 can be mutually combined using a sealant (not shown). Further, the liquid crystal layer 300 may be formed by injecting liquid crystal into a space between the substrate 100 and the substrate 200, for example, through a vacuum injection method or a liquid crystal dropping method.

Figure 4:
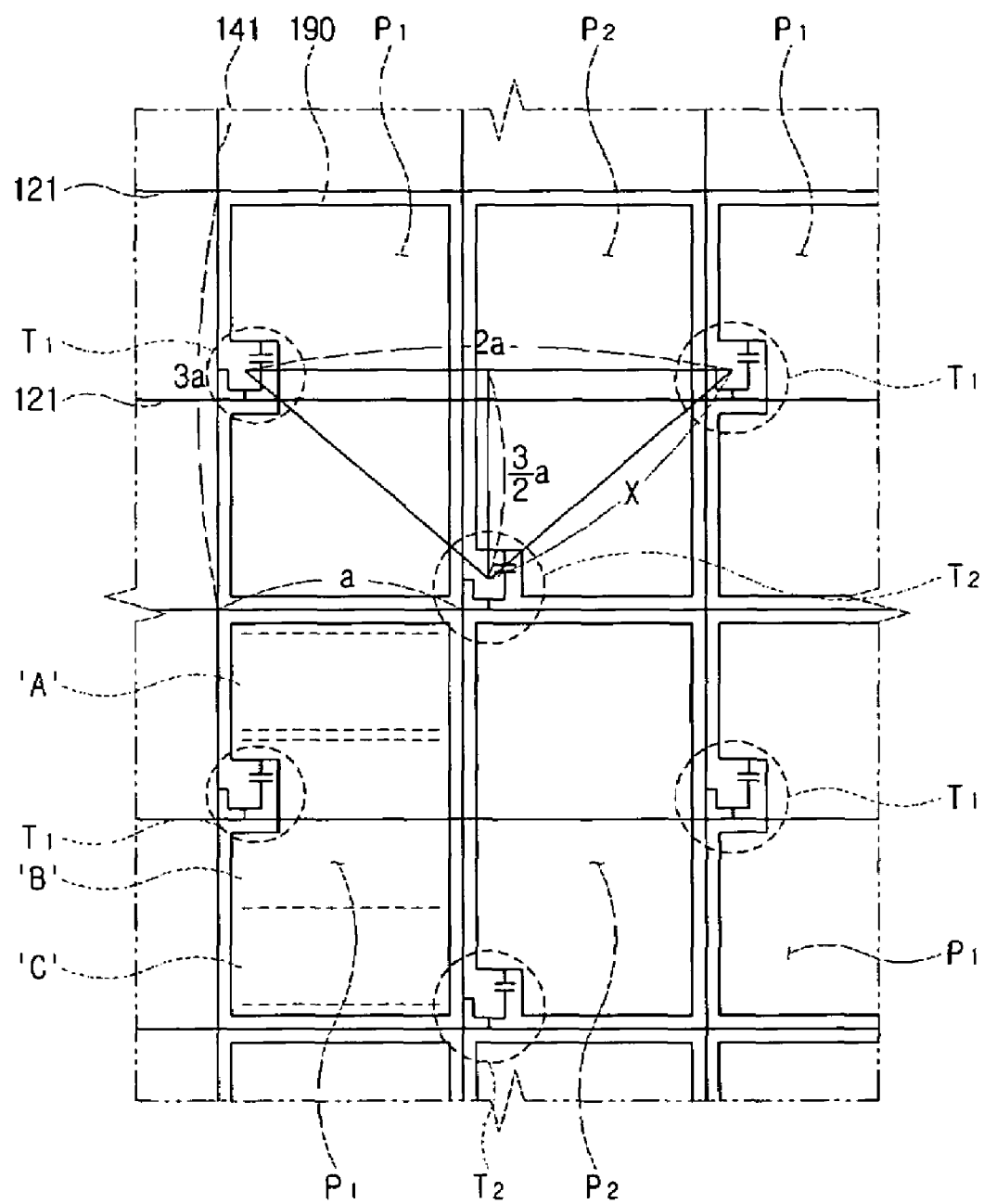
FIG. 4 is a view illustrating an effect of the first embodiment of the present invention.

In accordance with the aforementioned layout structure of a TFT, a flat panel display according to the first embodiment of the present invention will be described below with reference to FIG. 4.

First, for convenience of illustration, it is assumed that a TFT T connected to an additional gate line 121 traversing a pixel is a first TFT T1, and another TFT T adjacent to the first TFT T1 in a direction extended to a gate line 121 and connected to another gate line 121 at the lower end part of a pixel is a second TFT T2. Further, it is assumed that a pixel having the first TFT T1 located therein is a first pixel P1, and another pixel having the second TFT T2 located therein is a second pixel P2. As shown in FIG. 4, the pixel is divided into an upper region 'A', a middle region 'B' and a lower region 'C' for convenience of illustration. Moreover, it is assumed that the width (a direction extended to a data line) of a pixel is '3a', and the length (a direction extended to a gate line) of the pixel is 'a' in embodiments of the present invention.

The TFTs T according to the first embodiment of the present invention are alternately arranged in the middle region 'B' and the lower region 'C' for each pixel with a direction extended to the gate line 121 as reference, respectively. Further, with a direction extended to the data line 141 as reference, the first TFTs T1 are all located in the middle region 'B' along one column, and the second TFTs T2 are all located in the lower region 'C' along another column adjacent to a row direction of the pixel.

Through such a layout structure of TFTs T, the distance X between the TFTs T is always longer than the width 'a' of a pixel in a direction extended to the gate line 121. If the first TFT T1 is located at the center of the pixel, the distance X between the TFTs T is calculated by the following expression as shown in FIG. 4.

$$X^2 = a^2 + (9/4)a^2$$

From the expression, the distance X between the TFTs T is about 1.8a. Therefore, the distance X becomes longer by about 1.8 times, as compared to prior art, reducing the likelihood that an organic semiconductor solution, dropped on the surface when the organic semiconductor solution is jetted, will bounce and enter the bank 160 of an adjacent pixel That is, when an inkjet process is used, a process margin is increased by about 80%, thereby reducing a probability that the organic semiconductor solution may enter into the bank 160 of another pixel.

Accordingly, the thicknesses of the respective pixels are almost identical to one another so that a TFT property of each of the pixel as a whole appears to be uniform.

A layout structure of a TFT according to a second embodiment of the present invention will be described below with reference to FIG. 5. In the second embodiment, a different portion from the first embodiment will be described, and the rest of the omitted portions will be the same as the first embodiment. Further, like reference numerals indicate like elements for convenience of illustration.

Figure 5:
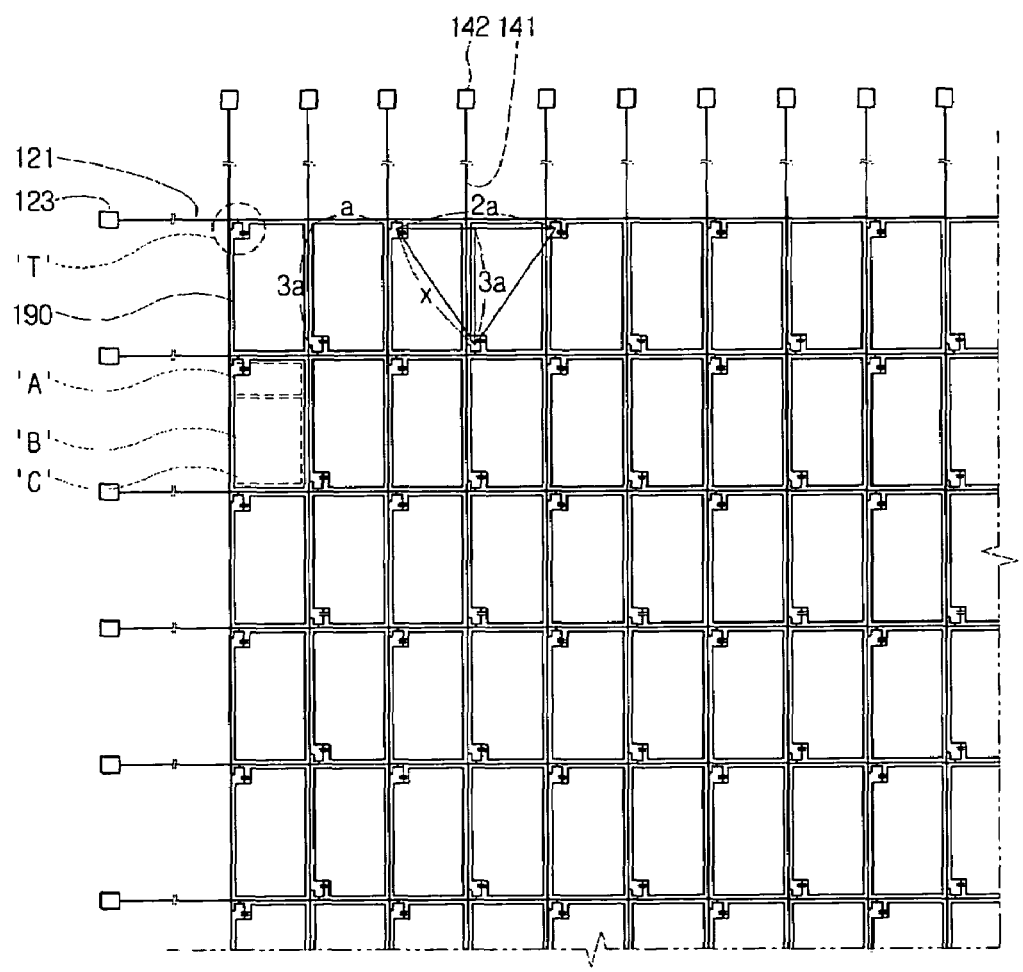
FIG. 5 is a layout view of a TFT substrate according to a second embodiment of the present invention.

FIG. 5 is a layout view of a TFT substrate according to the second embodiment of the present invention. As shown in FIG. 5, the TFTs T are alternately arranged in the upper region 'A' and the lower region 'C' for each pixel with a direction extended to a gate line 121 as reference. In case of such a layout structure of the TFT T, as shown in FIG. 5, a distance X between the TFTs T corresponding to one row is calculated as 3.16a by the following expression.

$$X^2 = a^2 + 9a^2$$

Therefore, the distance X between the TFTs T is increased about 3.16 times as compared with that according to the prior art, and a process margin is increased by 2.16%.

In the meantime, it can be seen that a distance between the TFTs T arranged in two adjacent rows is also increased incrementally, as compared with the prior art.

A layout structure of a TFT according to a third embodiment of the present invention will be described below with reference to FIG. 6. In the third embodiment, a different portion from the first embodiment will be described, and the rest of the omitted portions will be the same as the first embodiment. Further, like reference numerals indicate like elements for convenience of illustration.

Figure 6:
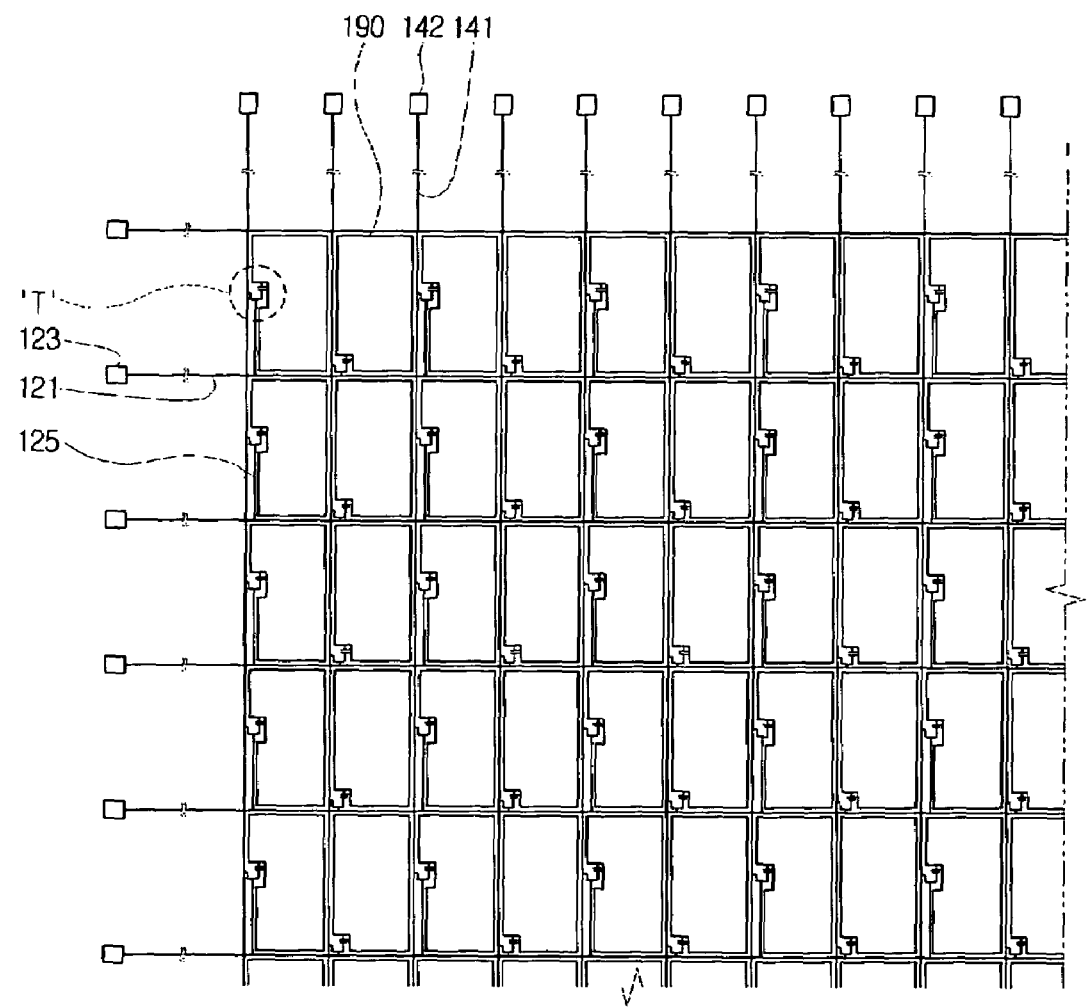
FIG. 6 is a layout view of a TFT substrate according to a third embodiment of the present invention.

FIG. 6 is a layout view of a TFT substrate according to the third embodiment of the present invention. In the third embodiment, the layout structure of the TFTs T is the same as the first embodiment but, unlike the first embodiment, TFT T has a structure that lacks an additional gate line 121 dividing a pixel into the upper and lower parts. Instead of the additional gate line 121, a branch gate line 125 branched from a gate line 121 is provided and extended along with an adjacent data line 141. Further, the TFT T located in the middle region 'B' is connected to the branch gate line 125. A distance between the TFTs T is determined depending on an extended length of the branch gate line 125. In a case where an end of the branch gate line 125 is located in the middle region 'B', each distance between the TFTs T is maximized so that a margin of an inkjet process can be increased.

Figure 7:
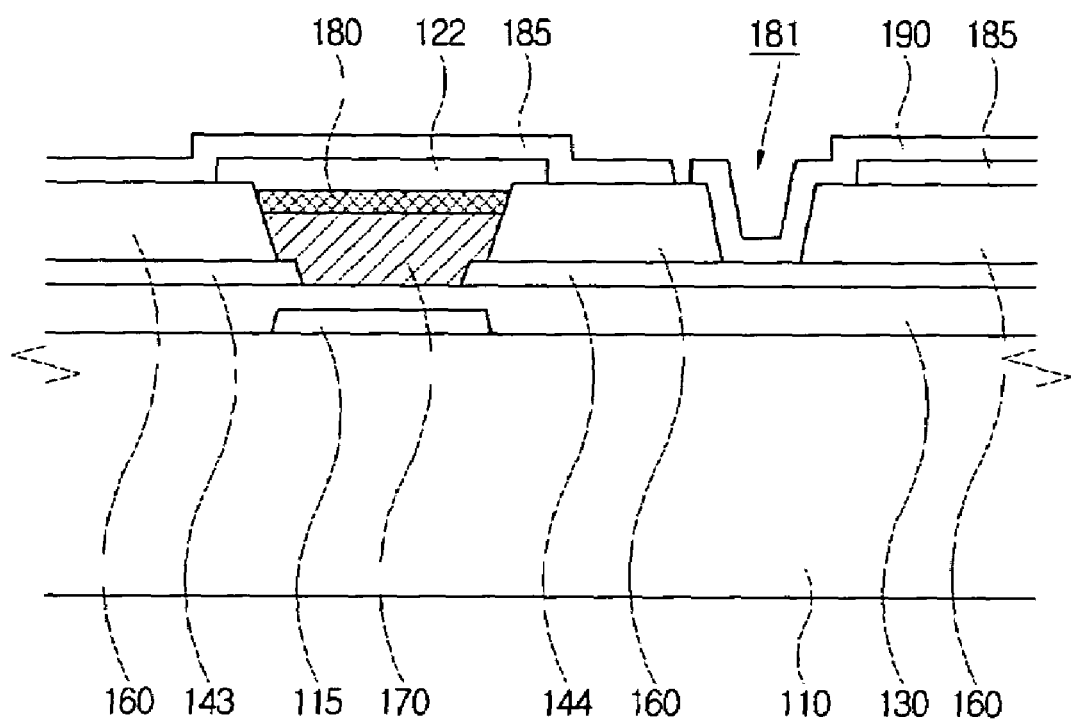
FIG. 7 is a cross-sectional view of a TFT substrate according to a fourth embodiment of the present invention.

FIG. 7 is a cross-sectional view of a TFT substrate according to a fourth embodiment of the present invention. In the first embodiment, a bottom gate type in which the gate electrode 122 is located beneath a TFT has been described, but the layout structure of the TFT T may be applied to a top gate type, in embodiments in which the gate electrode 122 is located on the top of the TFT T.

As shown in FIG. 7, the TFT substrate includes a light shielding film 115 formed on the insulation substrate 110; an insulation film 130 covering the light shielding film 115; source electrode 143 and drain electrode 144 defining a channel region, while being spaced apart from each other with respect to the light shielding film 115 interposed therebetween; a bank 160 for exposing at least a portion of each of the source electrode 143 and drain electrode 144 while surrounding the channel region; an organic semiconductor layer 170 formed inside the bank 160; and a gate electrode 122 formed the organic semiconductor layer 170. Also, an insulation film or first protection film 180 is interposed between the gate electrode 122 and the organic semiconductor layer 170. Further, the light shielding film 115 functions to shield light from entering into the organic semiconductor layer 170.

Although a exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A flat panel display, comprising:
   a plurality of gate lines for providing a gate signal to a gate electrode;
   a plurality of data lines insulated from the gate lines;
   a plurality of pixels disposed in an intersection of data lines and gate lines, each pixel divided into a upper region, a middle region, and a lower region; and
   a plurality of thin film transistors (TFT), each of the TFTs are disposed in the one of pixels and includes the gate electrode,
   wherein a first pixel and a second pixel of the pixels are adjacent to each other along one of the respective gate lines,
   wherein a first TFT of the plurality of TFTs is provided in the middle region of the first pixel, and a second TFT of the plurality of TFTs is provided in the lower region of the second pixel.

2. The flat panel display according to claim 1, further comprising a branch gate line branched from the gate line and extended along the data line while being adjacent to the data line, wherein the first TFT is connected to the branch gate line.

3. The flat panel display according to claim 2, wherein the branch gate line is extended to the middle region of the first pixel.

4. The flat panel display according to claim 1, wherein the first and the second pixels are alternatingly arranged relative to each other.

5. The flat panel display according to claim 1, wherein the distance between the adjacent TFTs is between about 1.2 to about 3.16 times larger than a width of the pixel.

6. The flat panel display according claim 1, wherein each of the TFTs contain an organic semiconductor layer formed by an inkjet method.

7. The flat panel display according to claim 1, wherein each of the TFTs further includes a source electrode and a drain electrode spaced apart to define a channel region, with the gate electrode interposed therebetween, and an organic semiconductor layer formed in the channel region.

8. The flat panel display according to claim 7, further comprising a bank for surrounding the channel region and for exposing at least a portion of each of the source electrode and the drain electrode, wherein the organic semiconductor layer is formed inside the bank.

9. The flat panel display according to claim 8, wherein a surface of the bank has water repellency and oil repellency.

10. The flat panel display according to claim 7, wherein each the source and the drain electrodes is made of one of ITO and IZO.

11. The flat panel display according to claim 7, wherein the organic semiconductor layer comprises one of a derivative containing tetracene or pentacene substituents; oligothiophene having 4 to 8 thiophene rings coupled to each other through 2 and 5 positions of thiophene rings; perylenetetracarboxylic dianhydride (PTCDA) or an imide derivative thereof; naphthalenetetracarboxylic dianhydride (NTCDA) or an imide derivative thereof; metallized pthalocyanine or a halogenated derivative thereof; perylene or coronene and a derivative containing substituents thereof; co-oligomer or co-polymer of thienylene and vinylene; thiophene thienylene or coronene, and a derivative containing substituents thereof; and a derivative containing one or more hydrocarbon chains of 1 to 30 carbons in an aromatic or heteroaromatic ring of said materials.

12. The flat panel display according to claim 7, wherein the organic semiconductor layer is soluble in an aqueous solution or organic solvent.

13. The flat panel display according to claim 1, wherein the TFT further comprises a light shielding film; wherein an insulation film covers the light shielding film; a source electrode and a drain electrode spaced apart defining a channel region, with the light shielding film interposed therebetween; and an organic semiconductor layer formed on the channel region.

14. The flat panel display according to claim 13, further comprising a gate electrode formed at a location corresponding to the light shielding film on the organic semiconductor layer, and a first protection film interposed between the organic semiconductor layer and the gate electrode.

15. The flat panel display according to claim 1, wherein each TFT has four nearest neighbors of the TFTs spaced apart by the same distance.

16. The flat panel display according to claim 15, wherein each TFT has four next nearest neighbors of the TFTs spaced apart by the same distance.

* * * * *